United States Patent
Kar-Roy et al.

(10) Patent No.: US 7,897,484 B2
(45) Date of Patent: Mar. 1, 2011

(54) FABRICATING A TOP CONDUCTIVE LAYER IN A SEMICONDUCTOR DIE

(75) Inventors: Arjun Kar-Roy, Irvine, CA (US);
Marco Racanelli, Santa Ana, CA (US);
David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 25 days.

(21) Appl. No.: 12/462,436

(22) Filed: Aug. 3, 2009

(65) Prior Publication Data

US 2009/0298285 A1 Dec. 3, 2009

Related U.S. Application Data

(62) Division of application No. 11/641,925, filed on Dec. 18, 2006, now Pat. No. 7,589,009.

(51) Int. Cl.
*H01L 21/00* (2006.01)

(52) U.S. Cl. .................. 438/459; 438/106; 438/109; 438/127; 438/637; 438/672; 257/E21.585; 257/E21.597; 257/E23.067; 257/E23.129; 257/E25.013

(58) Field of Classification Search ......... 438/106–127, 438/459–463, 612, 637, 672, 673; 257/E21.585–E21.597, 257/E23.011, E23.067, E23.129, E25.013
See application file for complete search history.

(56) References Cited

U.S. PATENT DOCUMENTS

| | | | |
|---|---|---|---|
| 7,098,070 B2 * | 8/2006 | Chen et al. | 438/106 |
| 7,300,857 B2 * | 11/2007 | Akram et al. | 438/459 |
| 7,427,803 B2 * | 9/2008 | Chao et al. | 257/659 |
| 7,449,784 B2 * | 11/2008 | Sherrer et al. | 257/774 |
| 7,704,874 B1 * | 4/2010 | Kar-Roy et al. | 438/637 |
| 2009/0321948 A1 * | 12/2009 | Wang et al. | 257/777 |

* cited by examiner

*Primary Examiner*—Michael S Lebentritt
(74) *Attorney, Agent, or Firm*—Farjami & Farjami LLP

(57) ABSTRACT

According to an exemplary embodiment, a method for fabricating a top conductive layer in a semiconductor die includes forming a through-wafer via opening through at least one interlayer dielectric layer in a through-wafer via region of the semiconductor die. The method further includes extending the through-wafer via opening through a substrate of the semiconductor die to reach a target depth. The method further includes forming a through-wafer via conductive layer in the through-wafer via opening, and concurrently forming the top conductive layer over an exposed top metal segment.

19 Claims, 7 Drawing Sheets

FABRICATING A TOP CONDUCTIVE LAYER IN A SEMICONDUCTOR DIE

This is a divisional of application Ser. No. 11/641,925 filed Dec. 18, 2006 now U.S. Pat. No. 7,589,009.

The present application claims the benefit of and priority to a pending provisional patent application entitled "Method for Fabricating a Frontside Through-Wafer Via in a Processed Wafer and Related Structure," Ser. No. 60/849,140 filed on Oct. 2, 2006. The disclosure in that pending provisional application is hereby incorporated fully by reference into the present application.

BACKGROUND OF THE INVENTION

1. Field of the Invention

The present invention is generally in the field of fabrication of semiconductor devices. More particularly, the invention is in the field of fabrication of conductive layers and structures in semiconductor wafers.

2. Background Art

Semiconductor devices, such as bipolar transistors and field effect transistors (FETs) that are fabricated using silicon or gallium arsenide technology, continue to increase in frequency, speed, and power. As a result, current semiconductor devices, such as bipolar transistors and FETs that are fabricated in a semiconductor die, also require conductive structures that provide effective, low resistance power and ground routing. For example, applications using bipolar transistors can require conductive structures that provide reduced resistance paths for power and ground routing to respective collector and emitter terminals, while FETs can require conductive structures that provide reduced resistance paths for power and ground routing to respective drain and source terminals.

Conventionally, power and ground routing for semiconductor devices is typically provided by interconnect metal segments that are fabricated in interconnect metal layers within the semiconductor die. However, due to thickness constraints on interconnect metal segments fabricated within the die and space constraints within the die, interconnect metal segments may not provide power and ground conduits with sufficiently low resistance for semiconductor devices that operate at increased power levels.

Thus, there is a need in the art for an effective method for fabricating conductive layers and structure with reduced resistance for power or ground routing for semiconductor devices.

SUMMARY OF THE INVENTION

A method for fabricating a top conductive layer in a semiconductor die and related structure, substantially as shown in and/or described in connection with at least one of the figures, as set forth more completely in the claims.

DETAILED DESCRIPTION OF THE INVENTION

The present invention is directed to a method for fabricating a top conductive layer in a semiconductor die and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
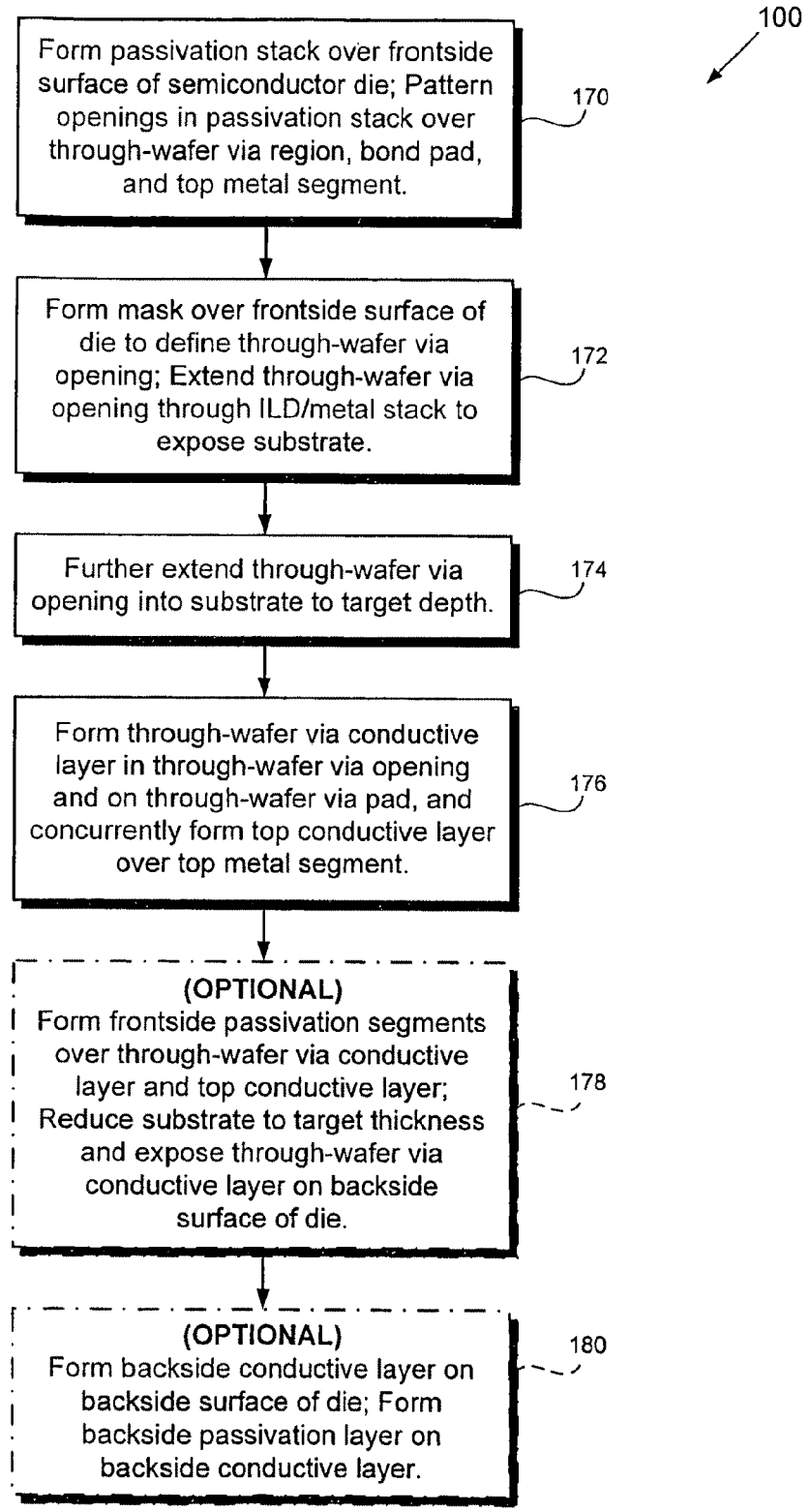
FIG. 1 shows a flowchart illustrating the steps taken to implement an embodiment of the present invention.

FIG. 1 shows a flowchart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention; however, other embodiments of the invention may utilize steps different from those shown in flowchart 100. It is noted that the processing steps shown in flowchart 100 are performed on a portion of processed wafer, which, prior to step 270, includes, among other things, a substrate, multiple interlayer dielectric layers and interconnect metal layers, and one or more semiconductor devices, such as bipolar transistors and/or CMOS devices. The portion of the processed wafer on which the processing steps shown in flowchart 100 are performed can be a portion of a semiconductor die. The processed wafer is also referred to simply as a wafer or a semiconductor die or simply a die in the present application.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
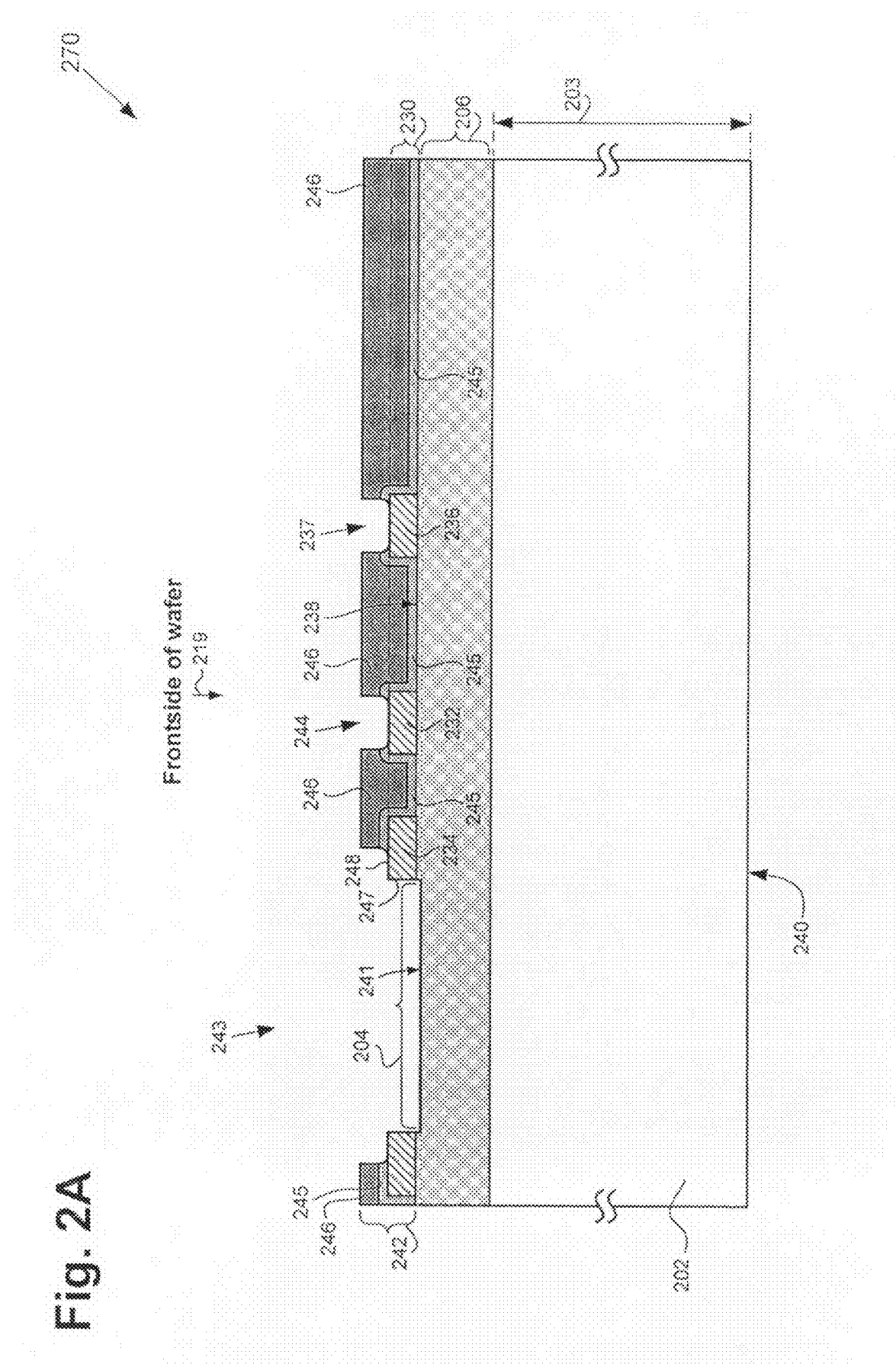
FIG. 2A illustrates a cross-sectional view, which includes a portion of a wafer processed according to an embodiment of the invention, corresponding to an initial step in the flowchart in FIG. 1.

Referring now to FIG. 2A, structure 270 of FIG. 2A shows a structure including a substrate, after completion of step 170 of flowchart 100 in FIG. 1. Structure 270 can be a portion of a semiconductor die, which can be a portion of a processed wafer. In structure 270, the frontside of the wafer is indicated by arrow 219. In structure 270, substrate 202 can comprise silicon and has initial thickness 203, which can be approximately 725.0 microns in an eight inch diameter silicon wafer, for example. In another embodiment, substrate 202 can comprise gallium arsenide (GaAs). Also in structure 270, interlayer dielectric (ILD)/metal stack 206 is situated over substrate 202. ILD/metal stack 206 can comprise a number of alternating interlayer dielectric layers and interconnect metal layers. In the present embodiment, ILD/metal stack 206 can comprise four interlayer dielectric layers and three interconnect metal layers, wherein each interconnect metal layer is situated adjacent to two interlayer dielectric layers. It is noted that each interlayer dielectric layer and interconnect metal layer in ILD/metal stack 206 is not shown in any of the figures in the present application so as not to obscure the invention. In other embodiments, ILD/metal stack 206 can comprise more or less than four interlayer dielectric layers and more or less than three interconnect metal layers.

Each of interlayer dielectric layers in ILD/metal stack 206 can comprise silicon oxide or other suitable dielectric material and can be formed by utilizing a chemical vapor deposition (CVD) process or other suitable deposition processes. In the present embodiment, the three interconnect metal layers in ILD/metal stack 206 can be respective first (i.e. M1), second (i.e. M2), and third (i.e. M3) interconnect metal layers in the semiconductor die and can each comprise copper, aluminum, or other suitable metal. Also in structure 270, interconnect metal segments (not shown in FIG. 2A) can be situated in respective interconnect metal layers in ILD/metal stack 206 and can provide ground connections for use by other interconnect metal segments in the respective interconnect metal layers. Also, each interconnect metal layer in ILD/metal stack 206 can be connected to an overlying interconnect metal layer by conventional vias, which are not shown in FIG. 2A.

Also in structure 270, interconnect metal layer 230 is situated over ILD/metal stack 206. Interconnect metal layer 230 can be a fourth (i.e. M4) interconnect metal layer in the semiconductor die, for example, can comprise copper, aluminum, or other suitable metal, and can be formed in a manner known in the art. In one embodiment, interconnect metal layer 230 can have a thickness of between 0.5 microns and 10.0 microns, for example. Also in structure 270, bond pad 232, through-wafer via pad 234, and top metal segment 236 are situated in interconnect metal layer 230. Bond pad 232 can be, for example, a signal bond pad, and can be coupled by an interconnect structure (not shown in FIG. 2A) to a semiconductor device (not shown in FIG. 2A) in the semiconductor die. Through-wafer via pad 234 can be ground in interconnect metal layer 230. In the present embodiment, through-wafer via pad 234 can be electrically connected to one or more interconnect metal segments (not shown in FIG. 2A) in ILD/metal stack 206. Top metal segment 236 can be utilized for routing ground or power in the semiconductor die, for example. In one embodiment, top metal segment 236 can be electrically connected to an overlying inductor, for example.

In structure 270, the frontside surface of the semiconductor die (hereinafter "frontside surface 238") refers the top surface of the processed wafer after bond pad 232, through-wafer via pad 234, and top metal segment 236 have been fabricated over ILD/metal stack 206. Thus, frontside surface 238 includes the top surface of ILD/metal stack 206 and the top and sidewall surfaces of bond pad 232, through-wafer via pad 234, and top metal segment 236. In structure 270, the initial backside surface of the processed wafer (hereinafter "initial backside surface 240") also refers to the initial bottom surface of substrate 202.

Referring now to step 170 in FIG. 1 and structure 270 in FIG. 2A, at step 170 of flowchart 100, passivation stack 242 is formed over frontside surface 238 and through-wafer via region opening 243, bond pad opening 244, and via 237 are formed in passivation stack 242 over respective through-wafer via region 204, bond pad 232, and top metal segment 236, respectively. Passivation stack 242 is situated over frontside surface 238 and includes lower passivation layer 245 and upper passivation layer 246. Lower passivation layer 245 is situated on frontside surface 238 and can comprise a layer of silicon nitride situated over a layer of silicon oxide, a layer of silicon only, a layer of silicon nitride only, or stacks of silicon oxide and silicon nitride layers. For example, lower passivation layer 245 can be formed by using a CVD process or other suitable deposition processes to deposit a layer of silicon oxide on frontside surface 238 and to deposit a layer of silicon nitride on the layer of silicon oxide. Upper passivation layer 246 is utilized to planarize the resulting wafer surface after lower passivation layer 245 has been formed on frontside surface 238 and can comprise photoimageable polyimide. Upper passivation layer 246 can be formed by depositing a layer of photoimageable polyimide on lower passivation layer 245 by spin coat, exposure and bake sequence or other suitable deposition processes. In one embodiment, upper passivation layer 246 can comprise non-photoimageable polyimide wherein the polyimide can be dry etched or lift-off polymers. In one embodiment, upper passivation layer 246 can comprise a dielectric material other than polyimide. In another embodiment, upper passivation layer 246 may not exist.

Through-wafer via region opening 243 is formed in passivation stack 242 to expose top surface 241 of ILD/metal stack 206 in through-wafer via region 204 and sidewall 247 and to expose a portion of top surface 248 of through-wafer via pad 234, bond pad opening 244 is formed in passivation stack 242 to expose bond pad 232, and via 237 is formed in passivation stack 242 to expose top metal segment 236. Through-wafer via region opening 243, bond pad opening 244, and via 237 can be formed by the same masking step, which can comprise a pad opening reticle over passivation stack 242. Through-wafer via region opening 243, bond pad opening 244, and via 237 can then be formed in upper passivation layer 246 by utilizing a suitable developing process to remove photoimageable polyimide in unmask (i.e. exposed) portions of upper passivation layer 246. Through-wafer via region opening 243, bond pad opening 244, and via 237 can then be extended through lower passivation layer 245 by utilizing, for example, a dry etch process including a dry etchant, such as sulphur hexafluoride (SF6), nitrogen trifluoride (NF3), and/or fluorocarbon (i.e. CxFy) gases, to remove unmasked portions of lower passivation layer 245. During the dry etch process utilized to etch lower passivation layer 245, small amounts of interlayer dielectric layer 228, bond pad 232, and top metal segment 236 are removed as a result of over-etching.

In another embodiment, upper passivation layer 246 may be added after through-wafer via region opening 243, bond pad opening 244, and via 237. The upper passivation layer may comprise dielectrics such as silicon oxide, silicon nitride or polyimides. An additional masking step is then needed to open through wafer via region opening 243 to remove the material deposited in upper passivation layer 246. The bond pad opening region and via opening region have the upper passivation layer 246 to protect the respective pad opening surface and top metal segment surface from subsequent processing steps and can be opened at a later stage during the process flow. The result of step 170 of flowchart 100 is illustrated by structure 270 in FIG. 2A.

Figure 2B:
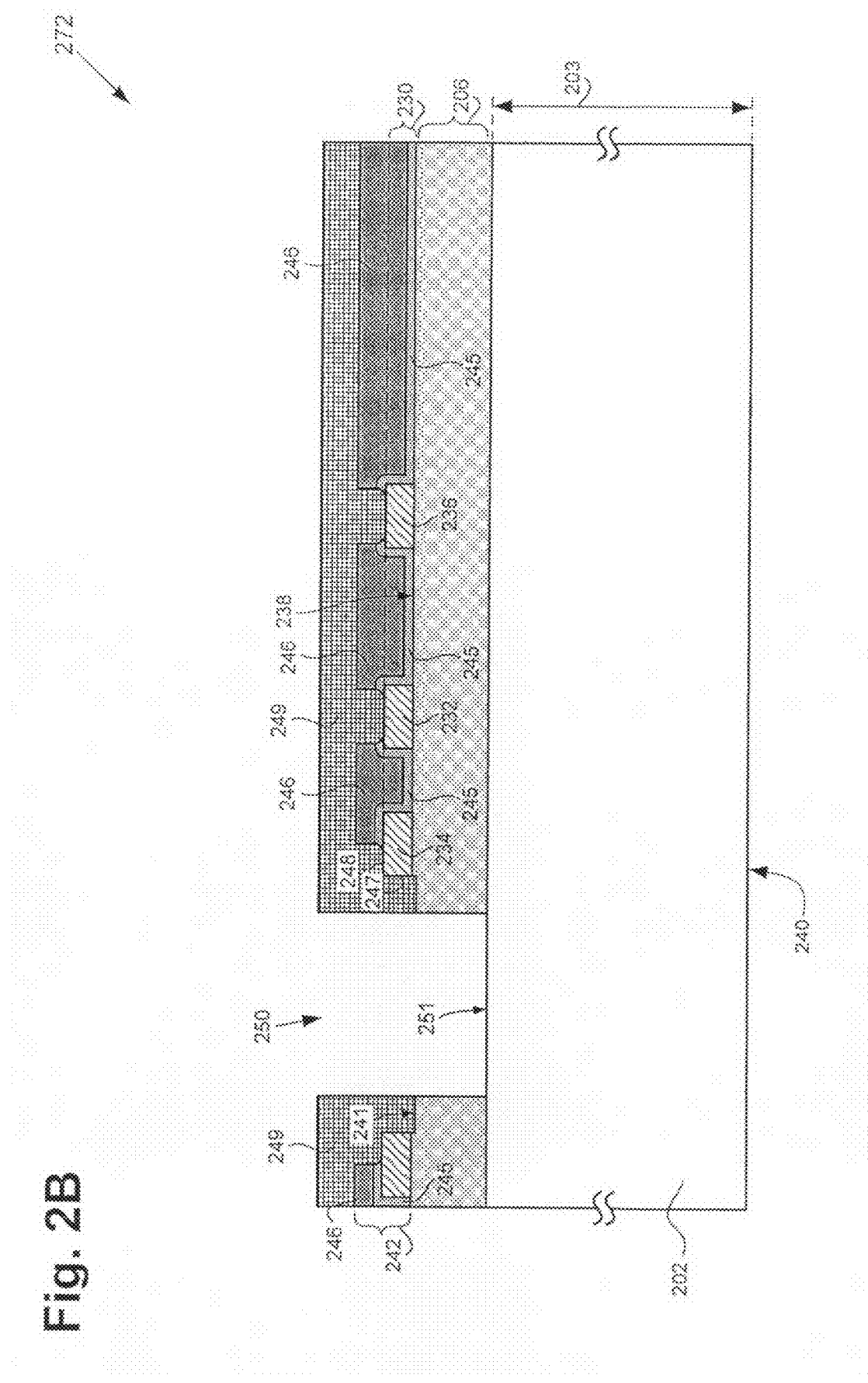
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, mask 249 is formed over frontside surface 238 in through-wafer via region 204 to define through-wafer via opening 250, and through-wafer via opening 250 is extended through ILD/metal stack 206 to expose substrate 202. Mask 249 is situated over passivation stack 242 and over frontside surface 238 and can comprise photoresist or other suitable a masking material. Mask 249 can be formed by depositing and patterning a layer of masking material such as photoresist in a manner known in the art. Through-wafer via opening 250, which is defined by mask 249, can be extended through interlayer dielectric layers in ILD/metal stack 206 by utilizing a suitable etch process to sequentially remove oxide material in the interlayer dielectric layers. It is noted that in through-wafer via region 204 (shown in FIG. 2A), ILD/metal stack 206 only comprises interlayer dielectric layers. The etch process can be selective to silicon so as to stop at top surface 251 of substrate 202. The result of step 172 of flowchart 100 is illustrated by structure 272 in FIG. 2B.

Figure 2C:
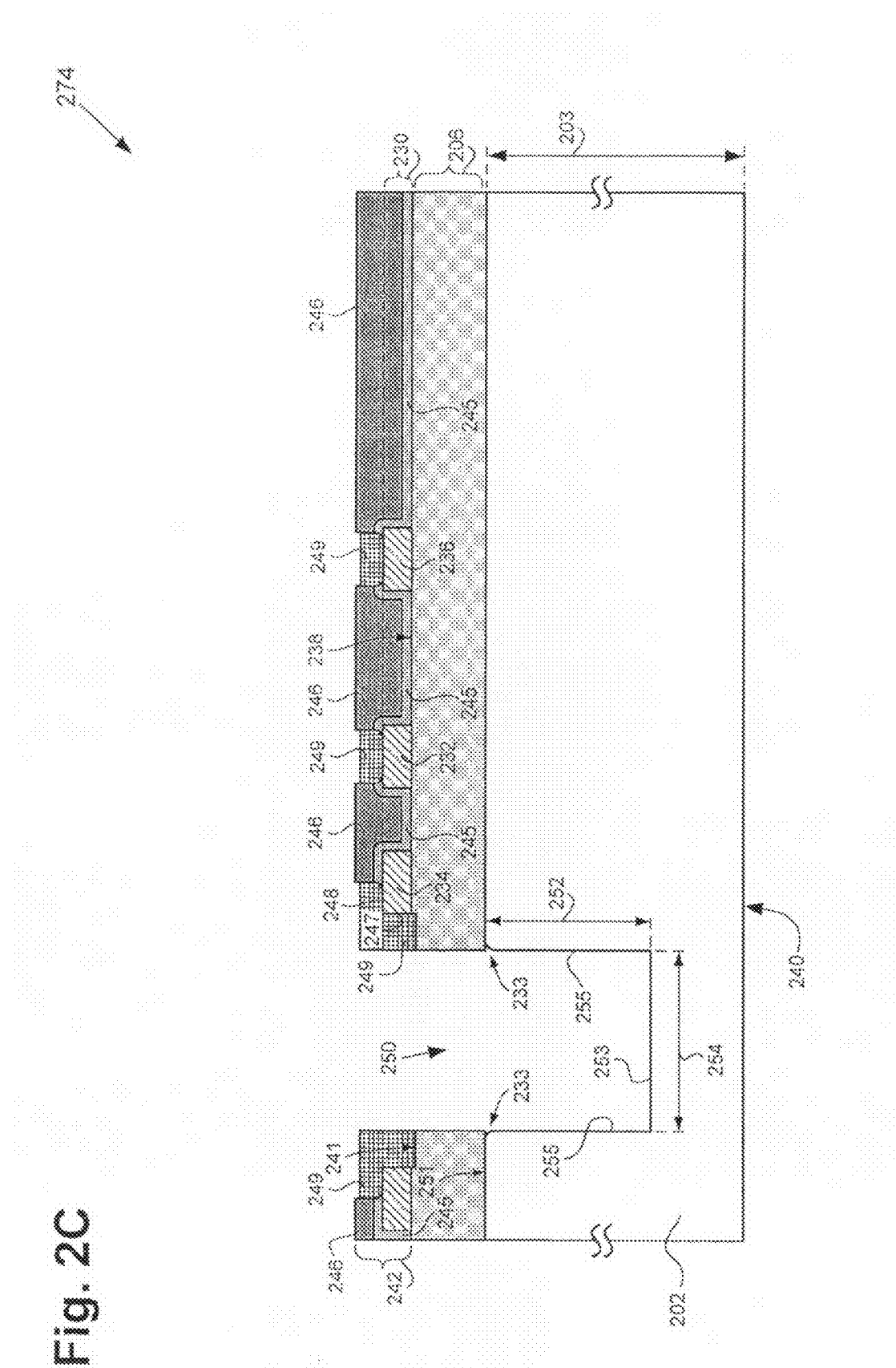
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, through-wafer via opening 250 is further extended into substrate 202 to target depth 252. Through-wafer via opening 250 extends through interlayer dielectric layers in ILD/metal stack 206 and a portion of substrate 202 to target depth 252, which corresponds to the distance between top surface 251 of substrate 202 and bottom surface 253 of through-wafer via opening 250. In other words, target depth 252 is the distance that bottom surface 253 of through-wafer via opening 250 extends below top surface 251 of substrate 202. For example, target depth 252 can be between 25.0 microns and 400.0 microns. Through-wafer via opening 250 has width 254, which can be between 2.0 microns and 100.0 microns, for example. Through-wafer via opening 250 can be extended into substrate 202 by using an anisotropic deep reactive-ion etching (DRIE) process, for example.

In a DRIE process, such as a DRIE process based on the Bosch process, sequential repetitions of an etch step and polymer-deposition step are utilized to achieve a high silicon etch rate with an anisotropic profile (i.e. substantially vertical sidewalls). A sulfur hexafluoride ($SF_6$) etchant can be utilized to etch silicon in the etch step of the DRIE process, for example. In the polymer-deposition step, for example, a fluorocarbon (i.e. CxFy) based etchant can be utilized to deposit a fluorocarbon polymer film on sidewalls 255 of through-wafer via opening 250 to provide protection from undesirable lateral etching. Non-Bosch DRIE processes can also be used to obtain tapered (non-vertical) sidewalls in silicon as well as gallium arsenide substrates.

During the DRIE process, undercut 233 of the substrate may be formed. This may prevent continuous adhesion/barrier layer deposition during subsequent steps in the undercut region. To ensure continuous adhesion/barrier layer deposition, the substrate undercut (e.g. undercut 233) can be either offset after it has formed or prevented from forming. For example, the substrate undercut can be offset by using a wet etch process that is selective to silicon to increase the through-wafer via width in the interlayer dielectric region (i.e. the portion of ILD/metal stack 206 situated in through-wafer via region 204 (shown in FIG. 2A)), while causing only a minimal etching of the through-wafer via in the silicon substrate. The wet etch process can utilize wet etch chemistries using hydrofluoric acid and/or phosphoric acid, for example. For example, the substrate undercut can be prevented from forming by utilizing an oversized mask to etch the through-wafer via in the interlayer dielectric region (i.e. the portion of ILD/metal stack 206 situated in through-wafer via region 204 (shown in FIG. 2A)) and then utilizing an undersized mask to etch the through-wafer via in the substrate. This approach can prevent the substrate undercut from forming if the overlap of the two masks is greater than the depth of any substrate undercut that would otherwise form. The result of step 174 of flowchart 100 is illustrated by structure 274 in FIG. 2C.

Figure 2D:
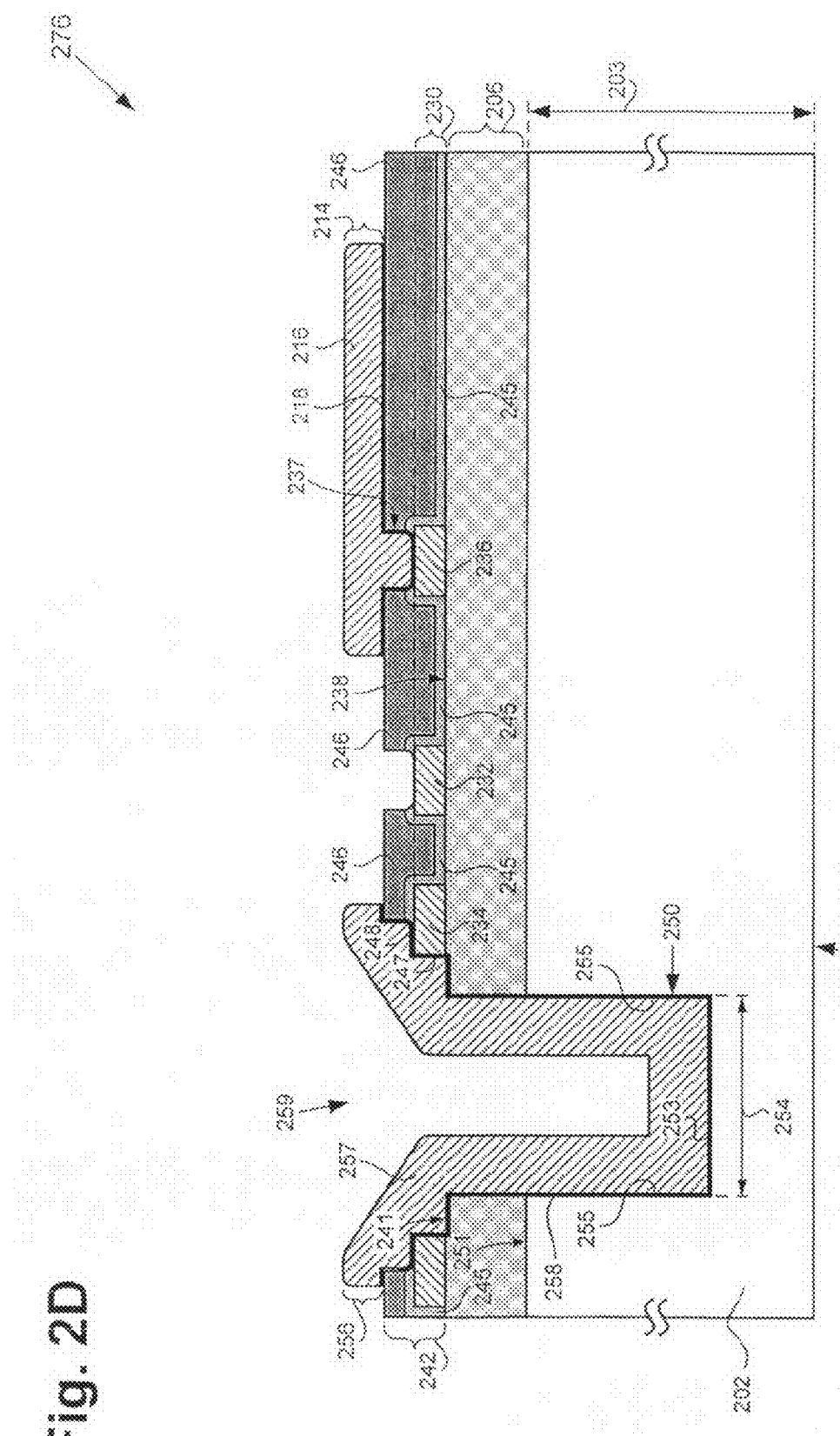
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, through-wafer via conductive layer 256 is formed in through-wafer via opening 250 and on sidewall 247 and top surface 248 of through-wafer via pad 234, and concurrently, top conductive layer 214 is formed on top metal segment 236, in via 237, and over passivation stack 242. Through-wafer via conductive layer 256 comprises metal layer 257 and adhesion/barrier layer 258 and top conductive layer 214 comprises metal layer 216 and adhesion/barrier layer 218. Prior to formation of through-wafer via conductive layer 256 and top conductive layer 214, mask 249 (shown in FIG. 2C) is removed and a clean process is performed to remove any unwanted material, such as native oxide, on sidewalls 255 and bottom surface 253 of through-wafer via opening 250 and on frontside surface 238. Mask 249 (shown in FIG. 2C) can be removed by utilizing a wet strip process or a dry strip process. The clean process can be an argon (Ar) presputter clean process, for example, which can be performed in a manner known in the art.

Adhesion/barrier layer 258 is situated on sidewalls 255 and bottom surface 253 of through-wafer via opening 250, on top surface 241 of ILD/metal stack 206, sidewall 247 and top surface 248 of through-wafer via pad 234, and a portion of passivation stack 242. Adhesion/barrier layer 258 can comprise titanium-tungsten (TiW), tantalum/tantalum nitride (Ta/TaN), titanium/titanium nitride (Ti/TiN), tungsten, or combinations of these layers, for example. Metal layer 257 is situated on adhesion/barrier layer 258 and can comprise copper. In other embodiments, metal layer 257 can comprise aluminum, tungsten, or other suitable metal or metal stack. In the present embodiment, metal layer 257 does not completely fill through-wafer via opening 250. In other embodiments, metal layer 257 can completely fill through-wafer via opening 250. Adhesion/barrier layer 218 is situated on top metal segment 236, on the sidewalls of via 237, and on a portion of passivation stack 242. Adhesion/barrier layer 218 is substantially similar in composition to adhesion/barrier layer 258. Metal layer 216 is situated on adhesion/barrier layer 218 and is substantially similar in composition to metal layer 257.

Through-wafer via conductive layer 256 and top conductive layer 214 can be formed by depositing an adhesion/barrier layer on sidewalls 255 and bottom surface 253 of through-wafer via opening 250, on top metal segment 236, and on the entire exposed frontside surface of the wafer, including frontside surface 238, passivation stack 242, and on bond pad opening 244 (shown in FIG. 2A), by utilizing, for example, a physical vapor deposition (PVD) process or a CVD process. A seed layer (not shown in FIG. 2D) comprising copper can then be depositing on the adhesion/barrier layer by using a PVD or a CVD process. In the present embodiment, a copper electrochemical deposition (ECD) mask (not shown in FIG. 2D) having an opening for metal layer 257 and an additional opening for metal layer 216 can then be formed on the seed layer (not shown in FIG. 2D). Next, a thick layer of copper can be deposited in the respective openings in the ECD mask (not shown in FIG. 2D) by utilizing an electrochemical deposition process or other suitable deposition processes to form metal layers 216 and 257. After metal layers 216 and 257 have been formed, the ECD mask (not shown in FIG. 2D) can be removed by utilizing a wet strip process or other suitable process.

After the ECD mask (not shown in FIG. 2D) has been removed, portions of the seed layer (not shown in FIG. 2D) and the adhesion/barrier layer that are not protected by (i.e. not situated under) metal layer 216 or metal layer 257 can be removed from passivation stack 242 and frontside surface 238 by utilizing, a wet etch process or a dry etch process. After the unprotected portion of the adhesion/barrier layer has been removed, adhesion/barrier layer 258 remains under metal layer 257 and adhesion/barrier layer 218 remains under metal layer 216. Next, a copper anneal process, which is optional, can be performed in a manner known in the art. Thus, as shown in FIG. 2D, through-wafer via 259, which is also referred to as a "frontside through-wafer via" in the present application, includes through-wafer via opening 250 and through-wafer via conductive layer 256, which includes adhesion/barrier layer 258 and metal layer 257, and top conductive layer 214 includes adhesion/barrier layer 218 and metal layer 216.

Top conductive layer 214, which is separate from through-wafer via conductive layer 256, is electrically connected to top metal segment 236 in interconnect metal layer 230 (e.g. M4) by via 237. Top conductive layer 214 can be patterned to form, for example, a part of an inductor residing on the semiconductor die. In one embodiment, top conductive layer 214 can be utilized to route power in the semiconductor die. In another embodiment, top conductor layer 214 can be utilized to route ground in the semiconductor die. Thus, in the present embodiment, a process flow that is utilized to concurrently form an innovative frontside through-wafer via is also advantageously utilized to form a separate thick conductive layer, e.g., top conductive layer 214, over a frontside surface of the semiconductor die, which can be utilized to form an inductor, for example. Since top conductive layer 214 is formed by utilizing the same process flow that is utilized to form the innovative through-wafer via 259, the present invention's top conductive layer is formed without requiring additional fabrication steps. Also, by appropriately patterning top conductive layer 214, an embodiment of the invention can advantageously utilize the large available space on top of the semiconductor die for fabrication of space consuming electrical components, such as inductors, or for wide ground and power lines. The result of step 176 of flowchart 100 is illustrated by structure 276a in FIG. 2D.

Figure 2E:
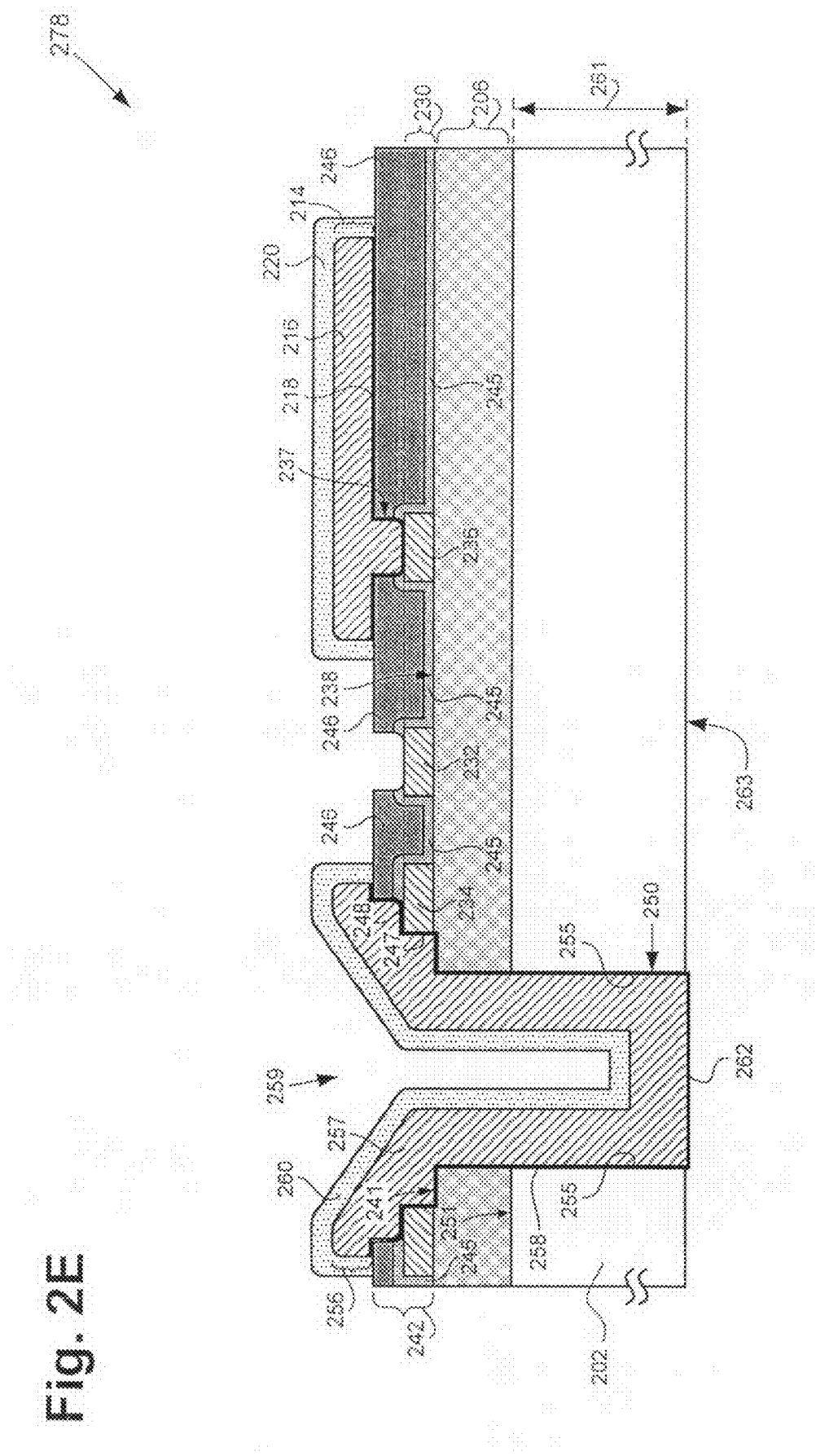
FIG. 2E illustrates a cross-sectional view, which includes a portion of a wafer processed according to an embodiment of the invention, corresponding to an intermediate step in the flowchart in FIG. 1.
Figure 2F:
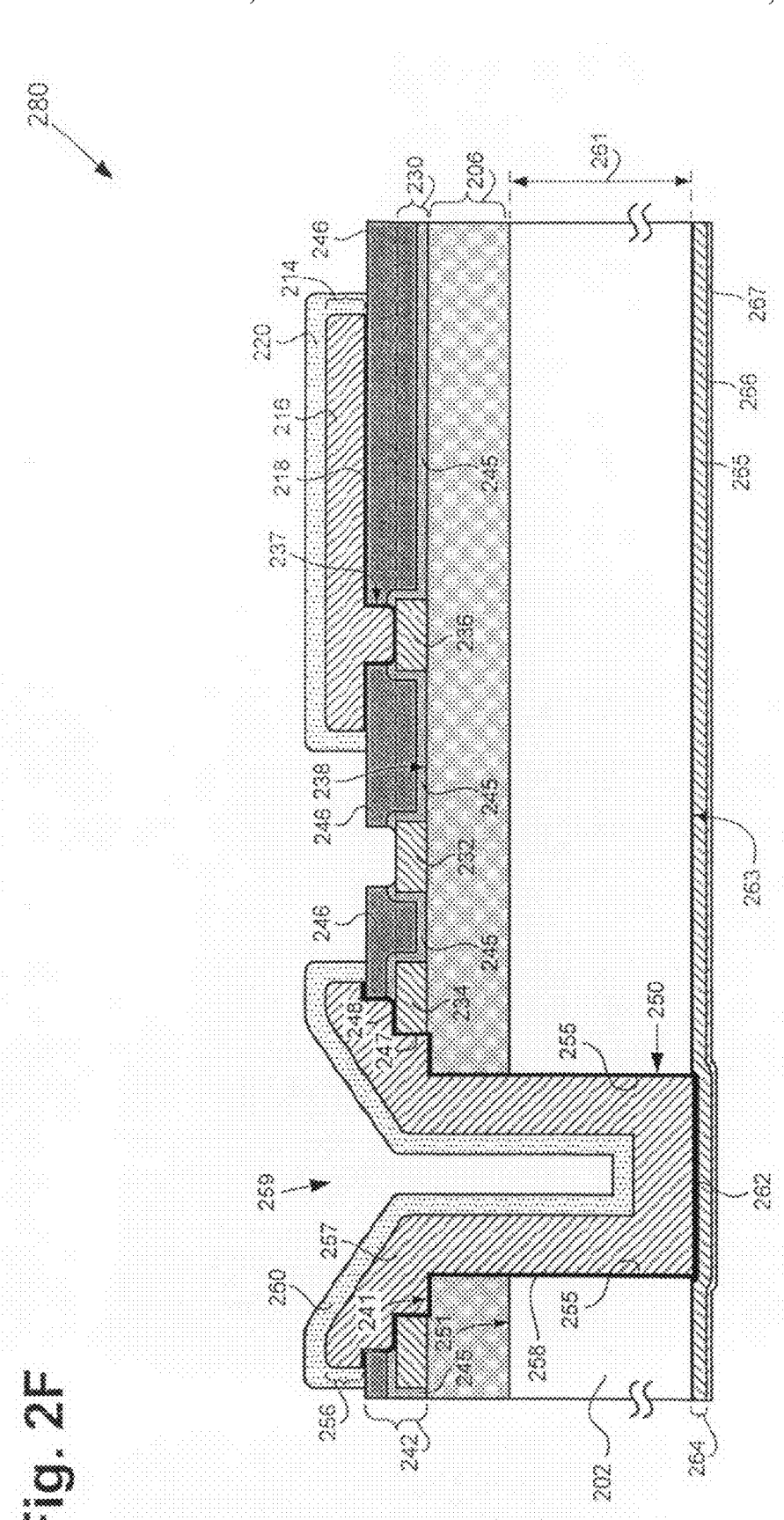
FIG. 2F illustrates a cross-sectional view, which includes a portion of a wafer processed according to an embodiment of the invention, corresponding to a final step in the flowchart in FIG. 1.

Steps 178 and 180, with resulting structures 278 and 280 in FIGS. 2E and 2F, are optional steps that may be performed after completing the formation and patterning of top conductive layer 214. Steps 178 and 180 are optional in that they may be carried out as part of the process flow to complete formation of the innovative through-wafer via 259. Referring to optional step 178 in FIG. 1 and structure 278 in FIG. 2E, at optional step 178 of flowchart 100, frontside passivation segments 260 and 220 are formed over respective through-wafer conductive layer 256 and top conductive layer 214, and a thinning process is performed to reduce substrate 202 to target thickness 261 and to expose bottom portion of through-wafer via conductive layer 256. Frontside passivation segments 260 and 220, which are formed to prevent oxidation of respective metal layers 257 and 216 as well as for mechanical damage protection during subsequent die handling steps while packaging, are situated on through-wafer via conductive layer 256 and top conductive layer 214 and can comprise photoimageable polyimide or benzocyclobutene (BCB). In one embodiment, frontside passivation segments 260 and 220 can comprise non-photoimageable polyimide. In another embodiment, frontside passivation segments 260 and 220 can be formed on respective through-wafer via conductive layer 256 and top conductive layer 214 using a maskless process by utilizing an electrochemical deposition process to form a nickel/gold (Ni/Au) stack. In the present embodiment, frontside passivation segments 260 and 220 can be formed by depositing a layer of photoimageable polyimide or BCB on through-wafer via conductive layer 256, top conductive layer 214, and over frontside surface 238 and appropriately patterning the layer of photoimageable polyimide or BCB.

Target thickness 261 of substrate 202 can be approximately the same as target depth 252 shown in FIG. 2C, for example. Bottom portion 262 of through-wafer via conductive layer 256 of through-wafer via 259 has to be exposed on the final backside surface of the processed wafer (hereinafter "final backside surface 263"), which also refers to the final bottom surface of substrate 202. Substrate 202 can be reduced to target thickness 261 by performing a thinning process including a coarse silicon removal step and a fine silicon removal step. The coarse silicon removal step can be performed by utilizing a backgrinding process to reduce the thickness of substrate 202 to within approximately 25.0 microns of target thickness 262 without exposing conductive layer 256 of through-wafer via 259. After the coarse silicon removal step has been performed, a carrier wafer can be temporarily attached to the frontside of the processed wafer so as to support the thinned wafer during the fine silicon removal step. The carrier wafer can comprise silicon, sapphire, or glass and can be perforated or non-perforated, the latter enabling easier debond techniques. The carrier wafer can be mounted to the processed wafer by utilizing a temporary adhesive, such as laminated thermal adhesive film, ultraviolet curable film, or other suitable bonding materials as are known in the art. In one embodiment, a carrier wafer may not be utilized. In another embodiment, the carrier wafer may be mounted before the beginning of the backgrinding process.

The fine silicon removal step can then be performed to reduce substrate 202 to target thickness 261 and to expose bottom portion 262 of through-wafer via conductive layer 256 on final backside surface 263. The fine silicon removal step can be performed by utilizing a fine chemical mechanical polishing (CMP) process and/or an etch process, such as a suitable wet etch or dry etch process. An optional inspection process can be performed to inspect final backside surface 263 to verify that through-wafer via conductive layer 256 is exposed on final backside surface 263. In one embodiment, a mask can be formed on the backside surface of the semiconductor die after the coarse silicon removal step has been performed and a suitable etch process can be performed to remove silicon material covering bottom portion 262 of through-wafer via conductive layer 256. In another embodiment, the fine silicon removal step is performed first using a wet or dry etch process to expose all of the through-wafer vias across the wafer, followed by CMP step to remove the portions of the vias sticking out of the backside surface 263. The result of optional step 178 of flowchart 100 is illustrated by structure 278 in FIG. 2E.

Referring to optional step 180 in FIG. 1 and structure 280 in FIG. 2F, at optional step 180 of flowchart 100, backside conductive layer 264, which includes adhesion/barrier layer 265 and backside metallization layer 266, is formed on final backside surface 263 and backside passivation layer 267 is formed on backside conductive layer 264. Prior to forming backside conductive layer 264, a clean process can be performed to remove unwanted material, such as native oxide, from final backside surface 263 by utilizing an argon (Ar)

sputter process or other suitable processes. Adhesion/barrier layer 265 of backside conductive layer 264 is situated on final backside surface 263 and can comprise titanium-tungsten (TiW), tantalum/tantalum nitride (Ta/TaN), or titanium/titanium nitride (Ti/TiN), tungsten, or combinations of these layers, for example. Adhesion/barrier layer 265 can be formed on final backside surface 263 by utilizing, for example, a PVD process or a CVD process. Backside metallization layer 266 of backside conductive layer 264 is situated on adhesion/barrier layer 265 and can comprise copper. In other embodiments, backside metallization layer 266 can comprise aluminum, gold, other suitable metal, or a suitable metal alloy. In the present embodiment, backside metallization layer 266 can be formed by first depositing a copper seed layer (not shown in FIG. 2F) on adhesion/barrier layer 265 by utilizing a PVD process or a CVD process. A substantially thicker layer of copper can then be deposited on the copper seed layer (not shown in FIG. 2F) by utilizing an electrochemical deposition process or other suitable deposition processes.

Backside passivation layer 267 is situated on backside metallization layer 266 to prevent backside metallization layer 266 from oxidizing as well as for the die to be bonded to the package substrate. Backside passivation layer 267 can comprise nickel-gold (Ni/Au) or other suitable metals. Backside passivation layer 267 can be formed, for example, by depositing a layer nickel-gold on backside metallization layer 266 by utilizing an electrochemical deposition process or other suitable deposition processes. After backside passivation layer 267 has been formed, the carrier wafer can be removed from the frontside of the processed wafer in a manner known in the art.

The invention's top conductive layer is a separate structure from through-wafer via 259, which provides a frontside through-wafer via that extends through a processed wafer and is in electrical contact with a substrate to advantageously provide a low-resistance ground conduit and an effective thermal conduit for semiconductor devices fabricated in the processed wafer. It is also noted that in one embodiment, through-wafer via 259 can be electrically insulated from substrate 202 by one or more insulative layers comprising, for example, silicon nitride or silicon oxide.

Thus, as discussed above, the invention achieves a thick, top conductive layer that is fabricated by utilizing the same process flow that is utilized to form an innovative frontside through-wafer via. As a result, the invention's top conductive layer, which is formed over the frontside surface of a semiconductor die, is advantageously fabricated without requiring additional processing steps. In the embodiment of the invention in FIGS. 1 and 2A through 2F, the invention's top conductive layer can be part of a low resistance inductor residing on a semiconductor die. In other embodiments, the invention's top conductive layer provides a thick, low resistance conduit for routing power or ground in a semiconductor die. It is understood to those of ordinary skill in the art that although the invention has been described in reference to a "wafer" or a "processed wafer," or a "semiconductor die," such semiconductor dies (or diced wafers) can be packaged using various semiconductor packaging techniques and processes. As such, the invention is manifestly applicable to fabricating semiconductor dies utilizing the principles of the invention in the manner described above, where such dies may or may not be later packaged.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for fabricating a top conductive layer in a semiconductor die and related structure have been described.

The invention claimed is:

1. A method for fabricating a top conductive layer in a semiconductor die, said method comprising steps of:
   forming a through-wafer via opening through at least one interlayer dielectric layer in a through-wafer via region of said semiconductor die;
   extending said through-wafer via opening through a substrate of said semiconductor die to reach a target depth;
   forming a through-wafer via conductive layer in said through-wafer via opening, and concurrently forming said top conductive layer over an exposed top metal segment.

2. The method of claim 1 wherein said step of forming said through-wafer via conductive layer in said through-wafer via opening, and concurrently forming said top conductive layer over said exposed top metal segment comprises steps of:
   forming an adhesion/barrier layer in said through-wafer via opening and over said exposed top metal segment;
   forming a metal layer over said adhesion/barrier layer.

3. The method of claim 2 further comprising a step of forming a frontside passivation layer over said metal layer.

4. The method of claim 1, wherein prior to said step of forming said through-wafer via opening, said method further comprises steps of:
   forming a passivation stack over a frontside surface of said semiconductor die;
   forming a through-wafer via region opening in said passivation stack to expose a top surface of said at least one interlayer dielectric layer and forming a via opening in said passivation stack to expose said top metal segment.

5. The method of claim 2 wherein said metal layer comprises metal selected from the group consisting of copper, aluminum, and tungsten.

6. The method of claim 1 wherein said top conductive layer is part of an inductor residing on said semiconductor die.

7. The method of claim 1 wherein said top conductive layer is utilized to route power in said semiconductor die.

8. The method of claim 1 wherein said top conductive layer is utilized to route ground in said semiconductor die.

9. The method of claim 1. wherein said substrate comprises silicon.

10. The method of claim 1 wherein said substrate comprises gallium arsenide.

11. A method comprising:
    forming a through-wafer via opening through at least one interlayer dielectric layer and a substrate in a semiconductor die;
    forming a through-wafer via conductive layer in said through-wafer via opening, and concurrently forming a top conductive layer over an exposed top metal segment in said semiconductor die.

12. The method of claim 11 wherein said forming said through-wafer via conductive layer in said through-wafer via opening, and concurrently forming said top conductive layer over said exposed top metal segment comprises:

forming an adhesion/barrier layer in said through-wafer via opening and over said exposed top metal segment;

forming a metal layer over said adhesion/barrier layer.

13. The method of claim 12 further comprising forming a frontside passivation layer over said metal layer.

14. The method of claim 12 wherein said metal layer comprises metal selected from the group consisting of copper, aluminum, and tungsten.

15. The method of claim 11, wherein prior to said forming said through-wafer via opening, said method comprises:

forming a passivation stack over a frontside surface of said semiconductor die;

exposing a top surface of said at least one interlayer dielectric layer to expose said top metal segment.

16. The method of claim 15 wherein said passivation stack comprises an upper passivation layer situated over a lower passivation layer, and wherein said upper passivation layer comprises polyimide.

17. The method of claim 11 wherein said top conductive layer is part of an inductor residing on said semiconductor die.

18. The method of claim 11 wherein said top conductive layer is utilized to route power in said semiconductor die.

19. The method of claim 11 wherein said top conductive layer is utilized to route ground in said semiconductor die.

* * * * *